(12) United States Patent
Fujii et al.

(10) Patent No.: US 7,653,280 B2
(45) Date of Patent: Jan. 26, 2010

(54) POLYMER OPTICAL WAVEGUIDE AND METHOD FOR MANUFACTURING THE SAME

(75) Inventors: Akira Fujii, Kanagawa (JP); Keishi Shimizu, Kanagawa (JP); Shigemi Ohtsu, Kanagawa (JP); Kazutoshi Yatsuda, Kanagawa (JP); Toshihiko Suzuki, Kanagawa (JP); Eiichi Akutsu, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/056,371

(22) Filed: Mar. 27, 2008

(65) Prior Publication Data
US 2009/0067796 A1    Mar. 12, 2009

(30) Foreign Application Priority Data
Sep. 10, 2007    (JP) .............................. 2007-234449

(51) Int. Cl.
*G02B 6/10* (2006.01)
*G02B 6/44* (2006.01)
(52) U.S. Cl. .................. 385/131; 385/101; 385/129
(58) Field of Classification Search .............. 385/101, 385/129–131
See application file for complete search history.

(56) References Cited

U.S. PATENT DOCUMENTS

| | | | | | |
|---|---|---|---|---|---|
| 5,170,461 | A | * | 12/1992 | Yoon et al. | 385/130 |
| 5,271,083 | A | * | 12/1993 | Lebby et al. | 385/130 |
| 5,970,186 | A | * | 10/1999 | Kenney et al. | 385/16 |
| 6,229,949 | B1 | * | 5/2001 | Ido et al. | 385/145 |
| 2003/0099420 | A1 | * | 5/2003 | Bhowmik et al. | 385/2 |
| 2004/0096180 | A1 | * | 5/2004 | Bintz et al. | 385/143 |
| 2005/0220419 | A1 | * | 10/2005 | Stevens | 385/55 |
| 2007/0275556 | A1 | * | 11/2007 | Bietsch et al. | 438/640 |

FOREIGN PATENT DOCUMENTS

| JP | 2001-311846 A | 11/2001 |
|---|---|---|
| JP | 2006-154684 A | 6/2006 |
| JP | 2006 267502 A | 10/2006 |

* cited by examiner

*Primary Examiner*—Uyen-Chau N Le
*Assistant Examiner*—Rhonda S Peace
(74) *Attorney, Agent, or Firm*—Sughrue Mion, PLLC (57) ABSTRACT

A polymer optical waveguide includes: an optical waveguide portion that includes a core and a cladding each formed of polymer material; and a conductive line that is installed along the core integrally with the optical waveguide portion, and that has an electrode surface for external connection exposed on a surface different from an end surface of the optical waveguide portion.

7 Claims, 8 Drawing Sheets

POLYMER OPTICAL WAVEGUIDE AND METHOD FOR MANUFACTURING THE SAME

CROSS-REFERENCE TO RELATED APPLICATIONS

This application is based on and claims priority under 35 U.S.C. 119 from Japanese Patent Application No. 2007-234449 filed Sep. 10, 2007.

BACKGROUND

1. Technical Field

The present invention relates to a polymer optical waveguide and method for manufacturing the same.

2. Related Art

Recently, in order to improve operation speed or integration degree with development of IC technology or high-performance electronic device, or in order to enable more mass transmission and speed-up of transmission, instead of use of electric wiring in data transmission, use of optical links between devices, or between boards or between chips in the device, a so-called optical interconnection has drawn an attention.

SUMMARY

According to an aspect of the present invention, a polymer optical waveguide includes: an optical waveguide portion that includes a core and a cladding each formed of polymer material; and a conductive line that is installed along the core integrally with the optical waveguide portion, and that has an electrode surface for external connection exposed on a surface different from an end surface of the optical waveguide portion.

BRIEF DESCRIPTION OF THE DRAWINGS

Exemplary embodiment of the present invention will be described in detail based on the following figures, wherein.

DETAILED DESCRIPTION

First Embodiment

Figure 1:
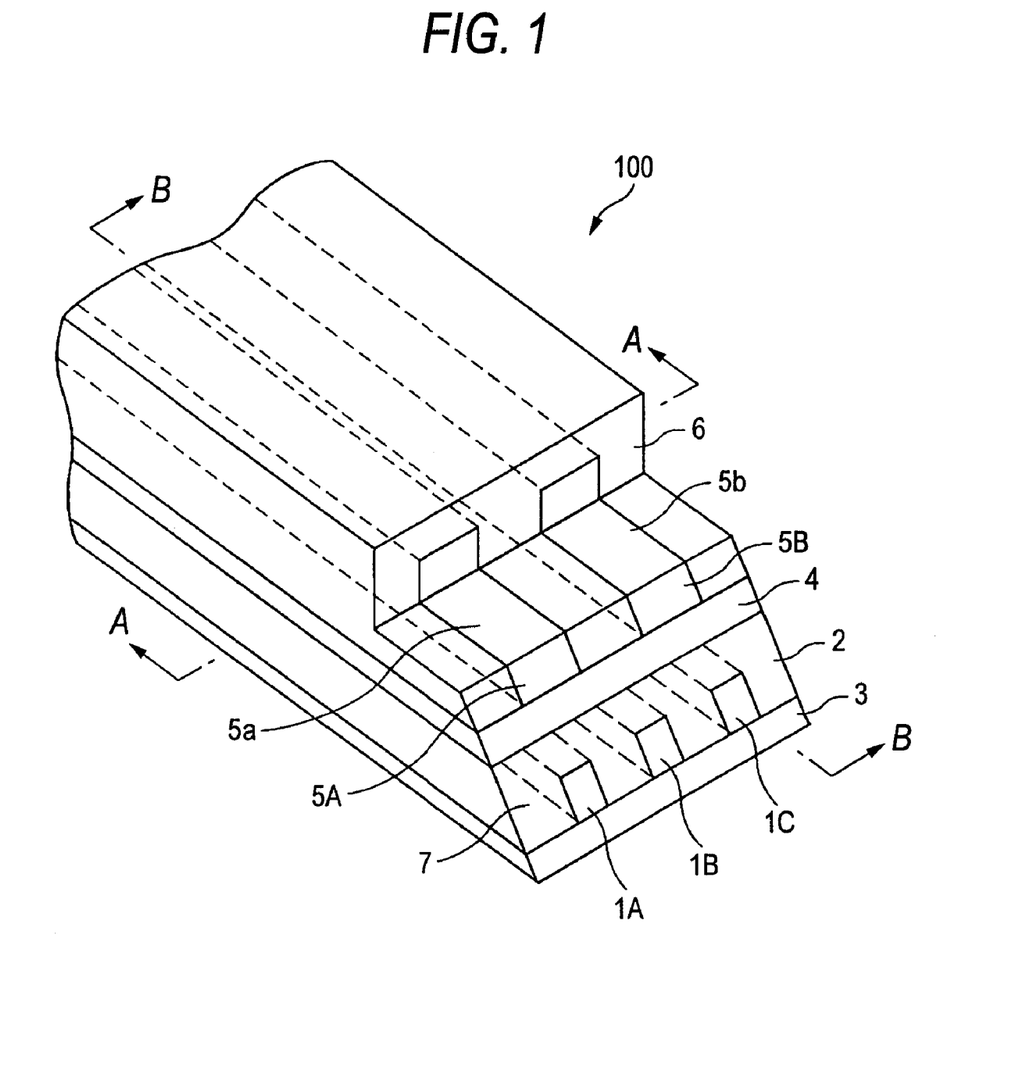
FIG. 1 is a perspective view showing a polymer optical waveguide according to a first embodiment of the invention.
Figure 2:
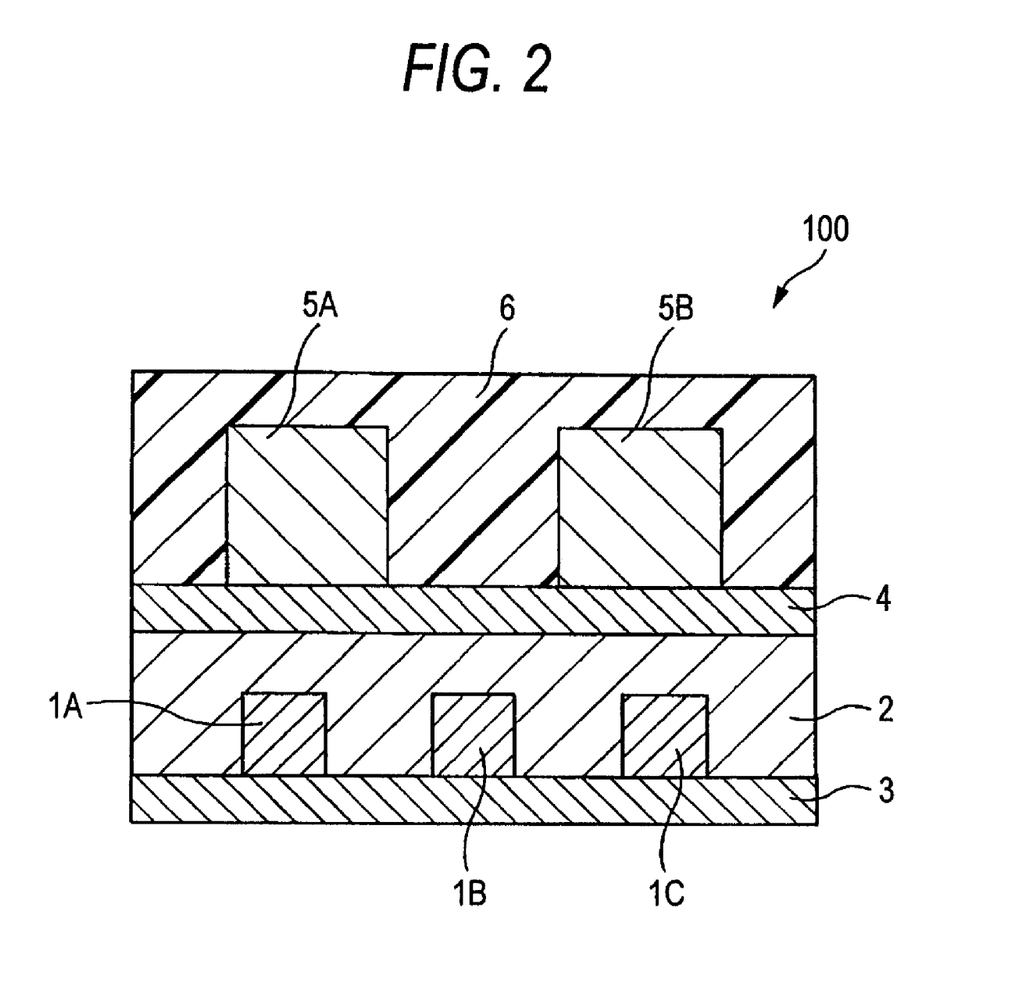
FIG. 2 is a sectional view taken along a line of A-A in the polymer optical waveguide of FIG. 1.
Figure 3:
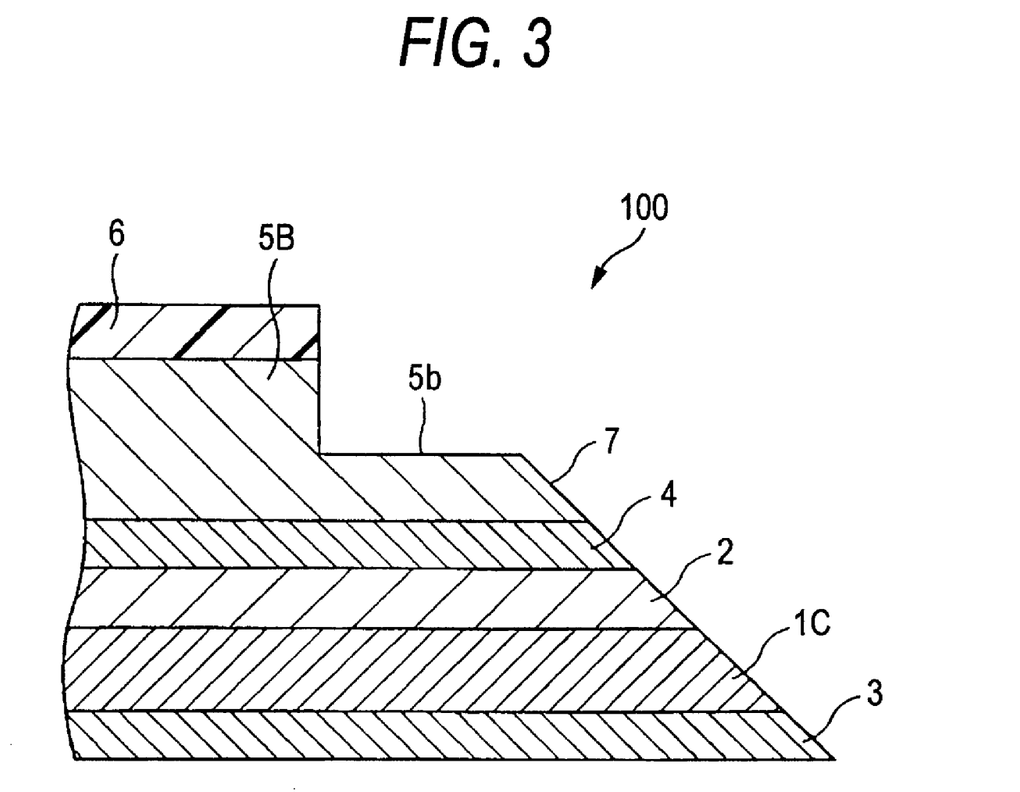
FIG. 3 is a sectional view taken along a line of B-B in the polymer optical waveguide of FIG. 1.

FIG. 1 is a perspective view showing a polymer optical waveguide according to a first embodiment of the invention. Further, FIG. 2 is a sectional view taken along a line A-A of the polymer optical waveguide in FIG. 1, and FIG. 3 is a sectional view taken along a line B-B of the polymer optical waveguide in FIG. 1.

(Constitution of Optical Waveguide)

A polymer optical waveguide 100 includes three waveguide cores 1A, 1B and 1C arranged in parallel, a cladding 2 which has a refractive index that is smaller than a refractive index of the waveguide core 1A to 1C and is provided so as to encompass the surroundings of the waveguide cores 1A to 1C, a lower base material 3 on which the waveguide cores 1A to 1C and the cladding 2 are provided, an upper base material 4 provided on the cladding 2, two conductive lines 5A, 5B provided on the upper base material 4 in parallel, and an insulating layer 6 provided on the upper base material 4 so as to cover the conductive lines 5A, 5B.

The thickness of the cladding 2 is determined, taking the size of the waveguide core 1A to 1C and the size of the conductive line 5A, 5B, into consideration; and the thickness of the insulating layer 6 is determined, synthetically taking the used optical system, current, and flexibility into consideration.

End portions of the waveguide cores 1A to 1C, the cladding 2, the lower base material 3, the upper base material 4, the conductive lines 5A, 5B are, as shown in FIG. 3, cut at 45 degrees by a dicing saw having an angled blade thereby to form an inclined surface 7. This inclined surface 7 becomes a reflection surface for optical interconnection with optical elements such as a light emitting device and a light receiving device.

The waveguide core 1A to 1C is formed of polymer material such as fluorinated polyimide, or silicon-based, polycarbonate-based, epoxy-based or acryl-based material. Though the three waveguide cores 1A to 1C are shown in FIG. 1, the number of the waveguide cores may be arbitrary number.

The cladding 2 can use a film material which is smaller than the waveguide core 1A to 1C in refractive index, and has optical properties such as refractive index and optical transparency, mechanical strength, heat stability, and flexibility. As this film material, there are, for example, an acryl-based resin, an epoxy-based resin, a styrene-based resin, an olefin-based resin, and a polyvinyl chloride-base resin.

The lower base material 3 is formed of polymer material such as norbornene-based material, fluorinated polyimide, silicon-based material, polycarbonate-based material, or acryl-based material.

The upper base material 4 is formed of polymer material such as norbornene-based material, silicon-based material, fluorinated polyimide, polycarbonate-based material, or acryl-based material. Though this upper base material 4 is not necessarily required, provision of the upper base material 4 improves adhesiveness for the conductive lines 5A, 5B and flatness.

The conductive lines 5A, 5B are wiring pattern formed of resin having conductivity and curing property. Though the two conductive lines 5A, 5B are shown in FIG. 1, the number of them may be arbitrary number. In these conductive lines 5A, 5B, as shown in FIGS. 1 and 3, nearly half portions on their upper sides are cut horizontally so that a different-in-level portion is formed at their end portions, and the exposed surfaces are used as electrode surfaces 5a, 5b for bonding-connection. Further, electrode surfaces having the same structure as the structure of the electrode surfaces 5a, 5b are provided also at the other end (not shown) of the polymer optical waveguide 100.

The insulating layer 6 is formed of a curable resin for protecting the conductive lines 5A, 5B. As this resin, there is, for example, UV curable or heat curable monomer or oligomer, or mixture of monomer and oligomer. In order to minimize the volumetric change (shrinkage) after curing of the curable resin, it is preferable to add, to the curable resin, a polymer which has compatibility with the curable resin and does not adversely affect the refractive index, elastic modulus, and transmission properties of the curable resin. Examples of the polymer include a methacrylic acid-based resin and an epoxy-based resin (Mounting Example of Polymer Optical Waveguide)

Figure 4:
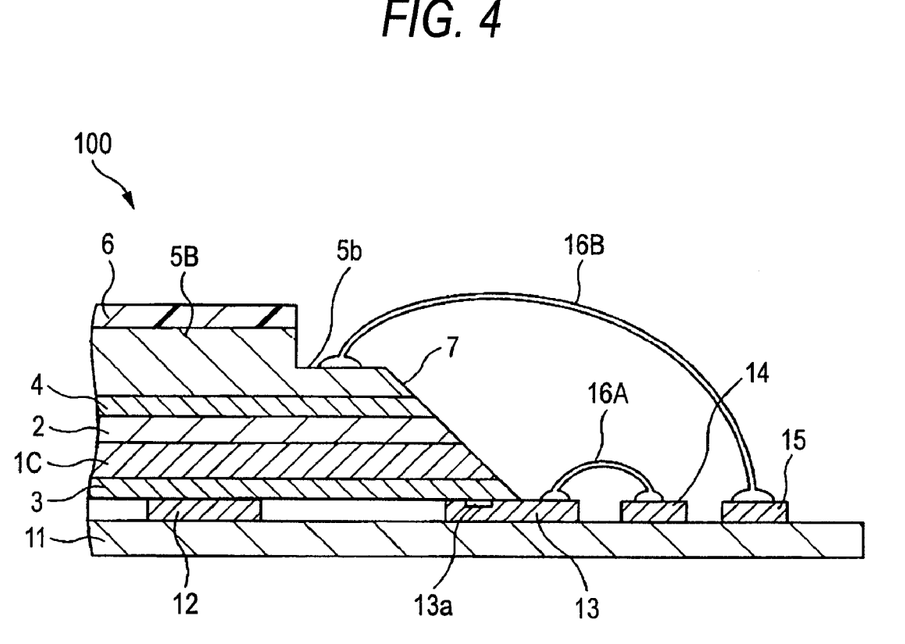
FIG. 4 is a diagram showing an example in which the polymer optical waveguide according to the first embodiment is mounted on a printed board.

FIG. 4 shows a diagram showing a mounting example of the polymer optical waveguide 100. The polymer optical waveguide 100 is mounted through a spacer 12 on a printed board 11. On this printed board 11, there are mounted a light emitting device 13 such as a semiconductor laser diode having a light emitting portion 13a, a driver IC 14 which is connected to the light emitting element 13 by a bonding wire 16A to drive the light emitting element 13, and a device (electric device) 15 which is connected to the electrode surface 5b by a bonding wire 16B.

The device 15 includes an interface IC, an amplification IC, and a signal processing IC which correspond to electric signals transmitted through the conductive lines 5A, 5B. Naturally, the conductive line 5B may be used for the purpose of power supply or the same potentialization (grounding).

In FIG. 4, when the driver IC 14 outputs, for example, an image signal through the bonding wire 16A to the light emitting device 13, the light emitting device 13 converts the image signal into an optical signal and emits the optical signal from the light emitting portion 13a toward the inclined surface 7. The emitted optical signal impinges on the waveguide core 1C and transmits toward the left side in the waveguide core 1C in FIG. 4. At a terminal end of the waveguide core 1C, a not-shown light receiving device is arranged, and the optical signal which has transmitted in the waveguide core 1C is received by this light receiving device.

Further, a control signal related to the image signal is output from the device 15, and output through the bonding wire 16B to the conductive lines 5A, 5B. The signal which has transmitted in the conductive lines 5A, 5B is input to a reception-side device (interface IC, amplification IC, signal processing IC, or the like) connected to the other end of the conductive line 5A, 5B, and subjected to the predetermined processing by this reception-side device.

(Method for Manufacturing Optical Waveguide)

Next, a method for manufacturing the optical waveguide 100 will be described. A process for manufacturing the optical waveguide 100 comprises the following seven steps.

(1) Step of manufacturing an optical waveguide portion consisting of the waveguide cores 1A to 1C and the cladding 2 (step of manufacturing optical waveguide portion)

(2) Step of manufacturing a master having protrusions corresponding to the conductive lines 5A, 5B (step of manufacturing master plate)

(3) Step of manufacturing a mold having recesses corresponding to the conductive lines 5A, 5B by means of the master obtained by the above step (2) (step of manufacturing mold)

(4) Step of tightly adhering the optical waveguide portion obtained by the above step (1) to the mold obtained by the above step (3) (step of tightly adhering optical waveguide portion to mold)

(5) Step of filling a curable conductive polymer material in the recess of the mold obtained by the above step (3) and curing the curable resin (6) Step of releasing the mold from the above optical waveguide portion and exposing the conductive lines 5A, 5B on the optical waveguide portion (step of detaching mold from optical waveguide portion)

(7) Step of forming the insulating layer 6 formed of an insulating curable polymer material on the optical waveguide portion obtained by the above step (6) (step of forming insulator)

FIGS. 5A to 5G show a process for manufacturing the polymer optical waveguide 100. Referring to FIGS. 5A to 5G, each of the above steps (1) to (5) and (7) will be described below in detail.

(1) Step of Manufacturing Polymer Optical Waveguide

Firstly, an optical waveguide portion including waveguide cores 1A to 1C, a cladding 2, a lower base material 3 and an upper base material 4 is manufactured. For manufacture of this optical waveguide portion, a selective polymerization method, a RIE (reactive ion etching) method, a direct UV exposure method, an injection molding method, a stamper method, a photobleaching method, and the like can be appropriately selected. However, the adoption of methods indicated by the present inventors in JP-A-2004-29507, 2004-86144, and 2004-109927 is preferable from viewpoints of cost, readiness, and high performance of the manufactured waveguide.

In the waveguide cores 1A to 1C, in case of the manufacture by the methods indicated in the above related arts, since a core-forming curable resin is filled by a capillary action and vacuum suction in a gap (recess in the mold) formed between a mold and a film material, the curable resin to be used is appropriately determined also by viscosity. Further, in order to reproduce the core shape with high accuracy, it is necessary that a volumetric change of the curable resin after curing relative to the volume before curing is small.

Another polymer can be added to the core-forming curable resin in order to minimize the volumetric change (shrinkage) after curing of the core-forming curable resin. It is preferred that the polymer has compatibility with the core-forming curable resin and does not adversely affect the refractive index, modulus of elasticity and transmission properties of the resin. By the addition of another polymer, it is possible to minimize the volumetric change and in addition, control the viscosity or glass transition point of the curable resin. Examples of the polymer include, but not limited to, acrylic, methacrylic acid, and epoxy polymers.

Further, the refractive index of the core-forming curable resin must exceed that of the cladding 2. It is 1.50 or greater, preferably 1.53 or greater. The difference in the refractive index between the cladding 2 and the waveguide cores 1A to 1C is 0.01 or greater, preferably 0.03 or greater.

As resin of the cladding 2, there is, for example, an acryl-based resin (polymethyl methacrylate or the like), an alicyclic acrylic resin, a styrene-based resin (polystyrene, acrylonitrile-styrene copolymer or the like), an olefin-based resin (polyethylene, polypropylene, ethylene-propylene copolymer, or the like), an alicyclic olefin resin, a vinyl chloride-based resin, a vinylidene chloride-based resin, a vinyl alcohol-based resin, a vinyl butyral-based resin, an arylate resin, a fluorine-containing resin, a polyester-based resin (polyethylene terephthalate, polyethylene naphthalate, or the like), a polycarbonate-based resin, a cellulose diacetate, a cellulose triacetate, an amide-based resin (fatty group, aromatic polyamide, or the like), an imide-based resin, a sulfone-based resin, a polyether sulfone-based resin, a polyether etherketon-based resin, a polyphenylene sulfide-based resin, a polyoxymethylene-based resin, or mixtures of them.

As the alicyclic acrylic resin, there are used "OZ-1000", "OZ-1100", and the like (each, product of Hitachi Chemical Co., Ltd.) having an ester substituent in which an aliphatic cyclic hydrocarbon such as tricyclodecane has been introduced. As other examples of the alicyclic olefin resin, there are that having, in the main chain thereof, a norbornene structure; and that having, in the main chain thereof, a norbornene structure and in its side chain a polar group such as an alkyloxycarbonyl group (having, as an alkyl moiety, a C.sub. 1-6 alkyl group or a cycloalkyl group).

Of the alicyclic olefin resins, the alicyclic olefin resin having, in the main chain thereof, a norbornene structure and in its side chain a polar group such as an alkyloxycarbonyl group has optical properties, for example, low refractive index (a refractive index is about 1.50 and a difference in the refractive index between the waveguide core 1A to 1C and the cladding 2 can be sufficiently maintained) and high light transmittance, and has excellent heat resistance, so that it is suited for the polymer optical waveguide.

(2) Step of Manufacturing Master

Figure 5A:
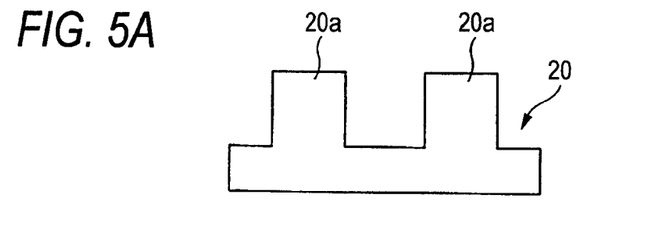
FIGS. 5A to 5G are a process for manufacturing the polymer optical waveguide according to the first embodiment.

Next, as shown in FIG. 5A, a master plate 20 with plural conductive line-forming protrusions 20a each having the shape corresponding to the shape of each conductive line 5A, 5B will be manufactured. For the manufacture of this master 20, for example, photolithography can be used. As other examples of the method for manufacturing the master plate 20, technology of manufacturing a master plate can be used, which is described in JP-A-2002-10240 and JP-A-2004-29507 which have been previously proposed by the present inventors. The size of the conductive line-forming protrusion of the master 20 is appropriately determined, depending on a current value.

(3) Step of Manufacturing Mold

Figure 5B:
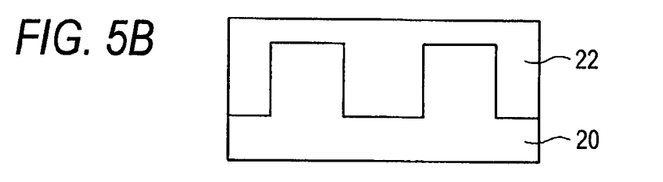

Next, a mold 21 with a mold recess 21a will be manufactured. First, as shown in FIG. 5B, a mold-forming curable resin layer 22 is formed by applying or pouring a mold-forming curable resin onto the protrusion 20a forming surface of the maser plate 20 thereby to form a mold 21. At this time, it is desirable to apply a releasing agent to the master plate 20 in advance in order to promote release between the maser plate 20 and the mold 21.

Next, after the resin layer 22 has been left for a predetermined time, it is subjected to vacuum-deforming for about ten minutes. Further, after the resin layer 22 has been subjected to dry processing if necessary, it is cured.

Figure 5C:
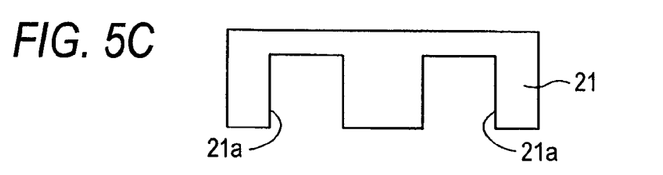

Next, the cured resin layer 22 is released from the master 20, thereby to obtain a mold 21 formed by the resin layer 22 as shown in FIG. 5C.

As the material of the resin layer 22, a curable organopolysiloxane which becomes a silicon elastomer or silicon resin after curing is preferred from the viewpoints of easy release, mechanical strength, size stability, hardness and adhesion with the cladding material. Specifically, the curable organopolysiloxane contains, in the molecule thereof, a methylsiloxane group, an ethylsiloxane group or a phenylsiloxane group. Further, as the curable organopolysiloxane, there are a one-component type and a two-component type used in combination with a curing agent. Further, it may be a heat curable type, a room temperature curable type (for example, cured by moisture in the air), or a UV curable type.

Of the curable organopolysiloxane, a liquid silicone rubber which becomes a silicone rubber after curing is excellent in releasability. The mold 21 using this silicone rubber can accurately copy the shape of the protrusion 20a of the master 20, and can tightly adhere to the upper base material 4. Further, very good interface of the mold recess 21a and the upper base material 4 can be formed, so that the curable resin 22 can be efficiently filled in only the mold recess 21a. Further, release between the upper base material 4 and the mold 21 becomes also easy. By using such the mold, the conductive lines 5A, 5B of a pattern having the degree of freedom can be manufactured very easily on the optical waveguide portion at high accuracy.

The liquid silicone rubber includes also a liquid silicon rubber in a highly viscous state such as a paste state, and the two-component type used in combination with the curing agent is preferred. Of the liquid silicon rubbers, especially, an addition type liquid silicon rubber is preferred, because it cures uniformly, in both surface and inside thereof, in a short time, generates no or less side products, has excellent releasability and exhibits small shrinkage. Further, liquid dimethylsiloxane rubber which becomes a rubber state by curing is especially preferred from the standpoints of adhesion, releasability, strength and hardness.

The liquid silicone rubber preferably has a viscosity of, for example, from about 500 to 7000 mPa·s, more preferably from about 2000 to 5000 mPa·s in consideration that the rubber can accurately copy the protrusion 20a of the master plate 20, mixing of air bubbles is minimized to facilitate vacuum defoaming and the mold having a thickness of several mm can be formed. Further, a solvent for viscosity adjustment can be added to this curable resin.

It is advantageous from the viewpoint of adhesion with the upper base material 4 that the surface energy of the resin layer 22 is within a range of from 10 to 30 dyn/cm, preferably from 15 to 24 dyn/cm. Further, the Share rubber hardness of the mold 21 is preferably from 15 to 80, more preferably from 20 to 60 from the viewpoints of the copying performance, shape retention of the protrusion and recess, and releasability. Further, the surface roughness (root means square roughness (RMS)) of the resin layer 22 is adjusted to 0.2 µm or less, preferably 0.1 µm or less from the viewpoint of copying performance.

Further, the resin layer 22 is preferably light transmissive in a UV region or a visible region, or in both regions of them. The reason why the resin layer 22 is light transmissive in the visible region is because it can facilitate alignment when the mold 21 is tightly adhered to the upper base material 4, the filling work of the conductive line-forming curable resin in the recess of the mold 21 can be observed and completion of the resin-filling can be confirmed easily.

Further, the reason why the resin layer 22 is light transmissive in the UV region is because when a UV curable resin is used as the conductive line-forming curable resin, the resin is UV cured through the mold 21. The transmittance of the mold 21 in the UV region (250 to 400 nm) is preferably 80% or greater.

Further, since the resin layer 22 must copy exactly the portion corresponding to each of the conductive lines formed on the master 20, it preferably has a viscosity of, for example, from about 2000 to 7000 mPa·s. Further, if necessary, each kind of additives can be added to the mold-forming curable resin.

Although the thickness of the resin layer 22 is determined in consideration of the handling ease as the mold 21, it should be set within a range of, for example, about 0.1 to 50 mm. Further, it is desirable that a filling port for filling the resin in the conductive line forming recess of the mold 21, and an exhaust port for exhausting the resin layer 22 from the conductive line forming recess (both ports are not shown) are formed in the mold 21. In this case, it is necessary to provide protrusions corresponding to the form of the filling port and exhaust port in the mold 21 for the master plate 20.

(4) Step of Tightly Adhering Optical Waveguide Portion to Mold

Figure 5D:
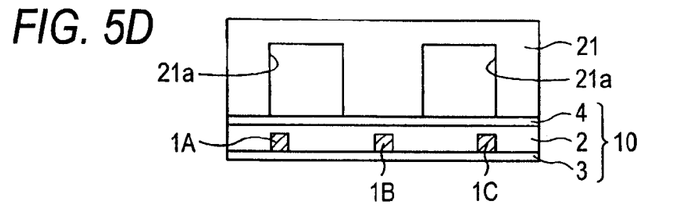

Next, as shown in FIG. 5D, the optical waveguide portion 10 manufactured in the above step (1) is tightly adhered to the mold recess 21a forming surface of the mold 21. Combination between use of liquid dimethylsiloxane rubber as the resin layer 22 and use of alicyclic olefin resin in the upper base material 4 are excellent in adhesion between the mold 21 and the upper base material 4, so that it is possible to prevent the protrusion and recess forming surface of the mold 21 from deforming. Further, even in case that the sectional area of the protrusion and recess forming surface of the mold 21 is very small (for example, 100×100 μm rectangular), utilization of a capillary action and vacuum suction makes quick filling of the conductive line-forming curable resin in the mold recess 21a possible.

(5) Step of Filling and Curing Conductive Line Material

Figure 5E:
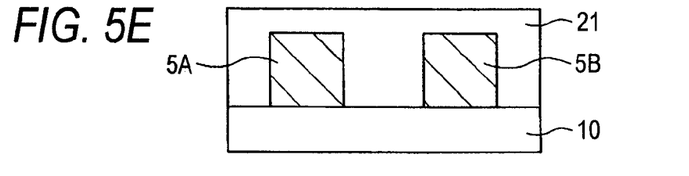
Figure 5F:
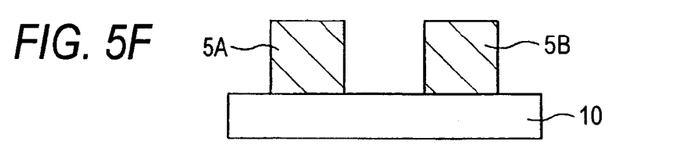

By utilizing the capillary action and vacuum suction, conductive line material, for example, a conductive line-forming curable resin such as radiation curable, electron beam curable or heat curable resin is filled in the mold recess 21a from the filling port (not shown) of the mold 21, and the extra conductive line-forming curable resin is exhausted to the outside from the exhaust port (not shown) of the mold 21. Thereafter, the filled conductive line-forming curable resin is cured by heat or light, thereby to manufacture conductive lines 5A, 5B as shown in FIG. 5E. Thereafter, as shown in FIG. 5F, the mold 21 is released from the optical waveguide portion 10 and the conductive lines 5A, 5B.

(6) Step of Forming Insulating Layer

Figure 5G:
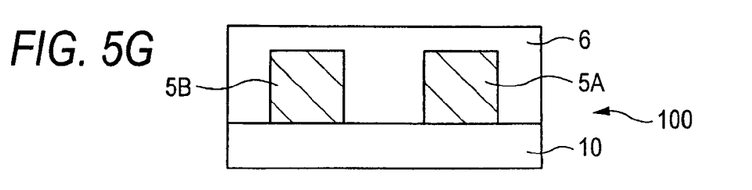

After the conductive lines 5A, 5B have been manufactured, as shown in FIG. 5G, a curable insulating material is applied on side surfaces and upper surfaces of the conductive lines 5A, 5B exposed from the upper base material 4 and cured thereby to form an insulating layer 6. As the curable insulating material, a curable resin is desirably used from viewpoints of cost, transparency, and easiness of manufacture. As the curable resin, there are, for example, a UV curable resin and a heat curable resin. For example, there are UV curable or heat curable monomers or oligomers, or mixtures of the monomer and oligomer. In order to minimize the volumetric change (shrinkage) after curing of the insulating portion-forming curable resin, it is desirable that another polymer having compatibility with the curable resin and not adversely affecting the refractive index, modulus of elasticity and transmission properties of the curable resin, for example, methacrylic acid-based or epoxy-based polymer is added to the curable resin.

After the insulating layer 6 has been formed, as shown in FIG. 3, one end of each of the optical waveguide portion, the conductive lines 5A, 5B, and the insulating layer is cut at 45 degrees by a dicing saw thereby to form an inclined surface 7. Further, the conductive lines 5A, 5B and the insulating layer 6 in a predetermined range from the inclined surface 7 are cut by the dicing saw horizontally from a position of the half thickness in the up/down direction of the conductive lines 5A, 5B, thereby to form electrode surfaces 5a, 5b. Similarly, the other end is also cut by the dicing saw thereby to form an inclined surface 7.

Second Embodiment

Figure 6:
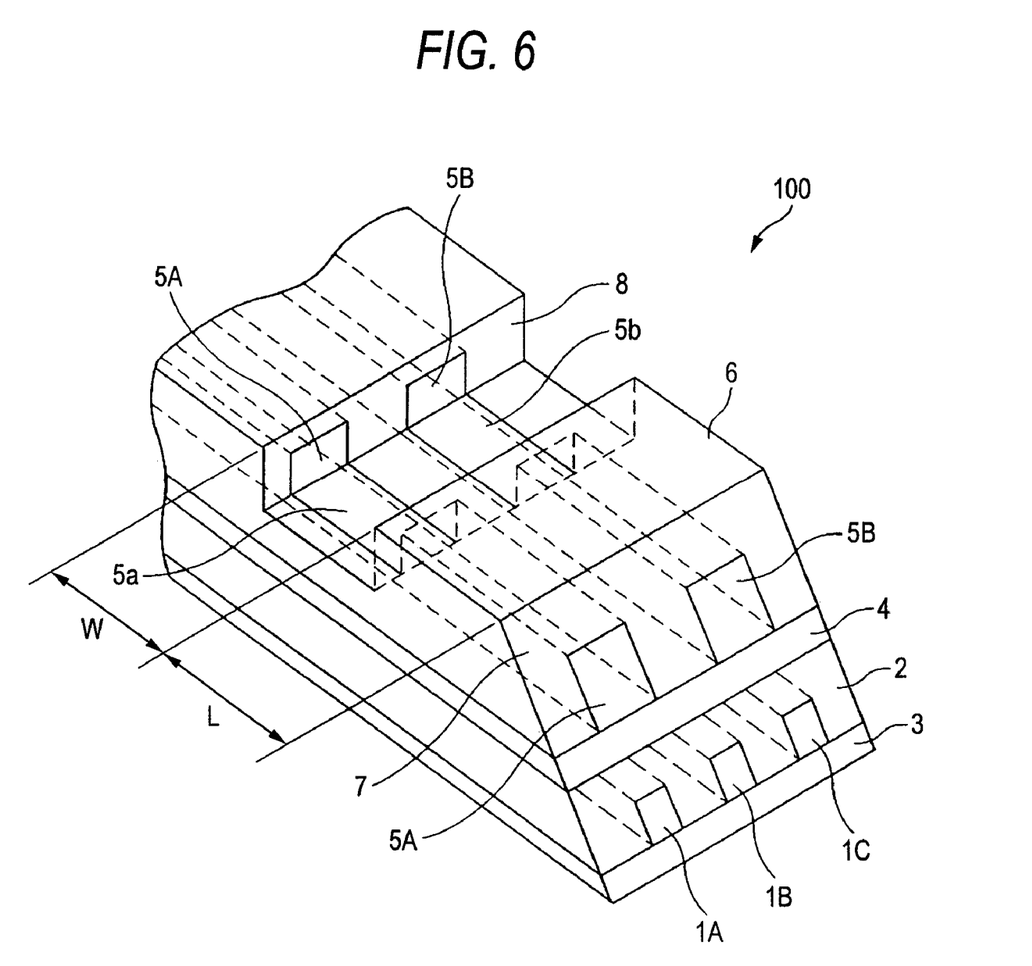
FIG. 6 is a perspective view showing a polymer optical waveguide according to a second embodiment of the invention.

FIG. 6 is a perspective view showing a polymer optical waveguide according to a second embodiment of the invention.

In this embodiment, the electrode surfaces 5a, 5b in the first embodiment are provided in a predetermined area in a position apart from the end portion, and other constitution is similar to that in the first embodiment.

In conductive lines 5A, 5B and an insulating layer 6, a cut portion 8 is formed by removing predetermined portions of the insulating layer 6 and the conductive lines 5A, 5B with a width w from a position at a distance L from the end edge of the upper surface of an inclined surface 7. On the upper surface of this cut portion 8, the conductive lines 5A, 5B are exposed. The surfaces of the conductive lines 5A, 5B exposed from this cut portion 8 become electrode surfaces 5a, 5b.

The distance L and the width W at which the cut portion 8 is provided are arbitrary, and can be freely determined according to arrangement of devices and circuit constitution, or according to possibility of interference of a bonding wire 16B with waveguide cores 1A to 1C exposed from the inclined surface 7.

A polymer optical waveguide 100 in this embodiment is mounted on a printed board similarly to the polymer optical waveguide 100 in the first embodiment shown in FIG. 4, and the electrode surfaces 5a, 5b are connected to devices 15 by the bonding wire 16B.

Third Embodiment

Figure 7:
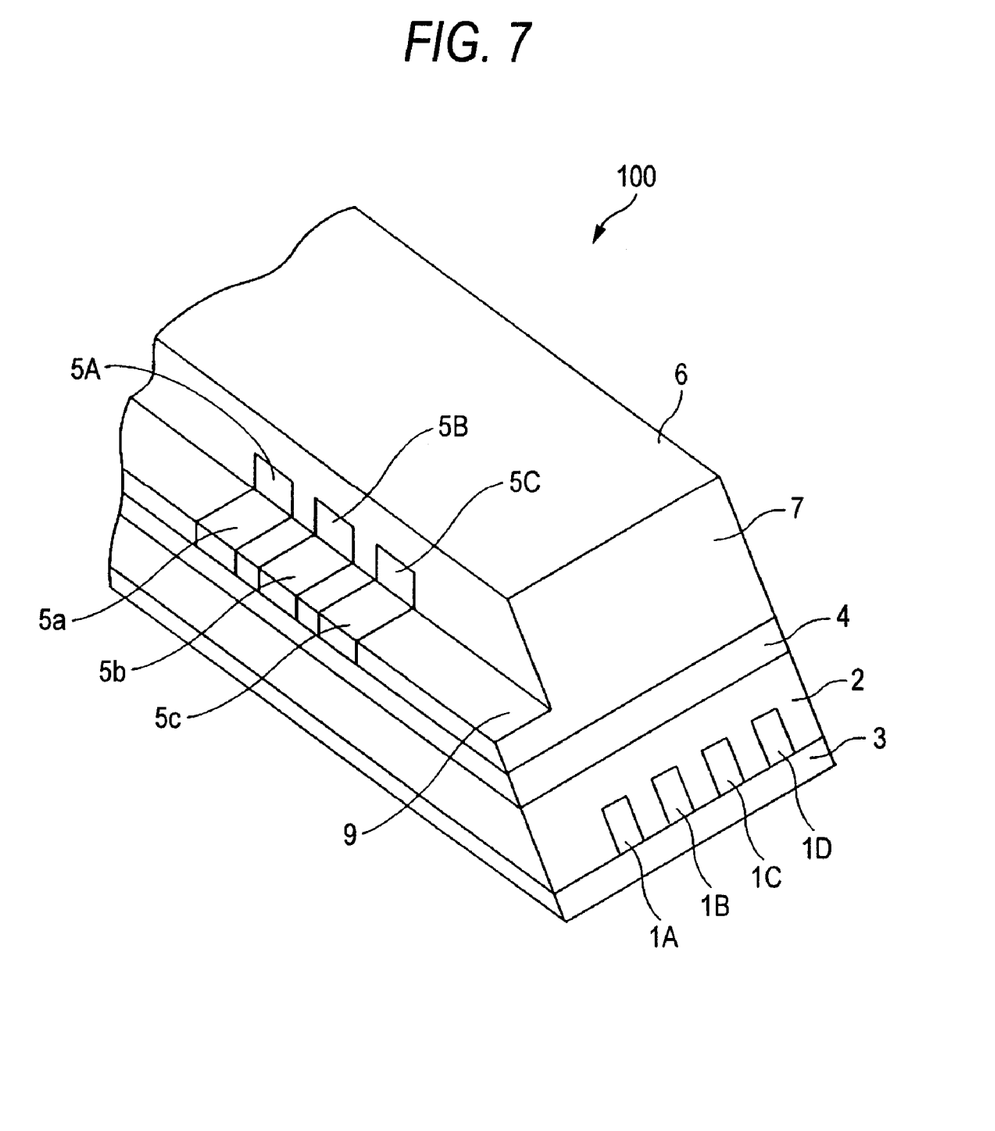
FIG. 7 is a perspective view showing a polymer optical waveguide according to a third embodiment of the invention.
Figure 8:
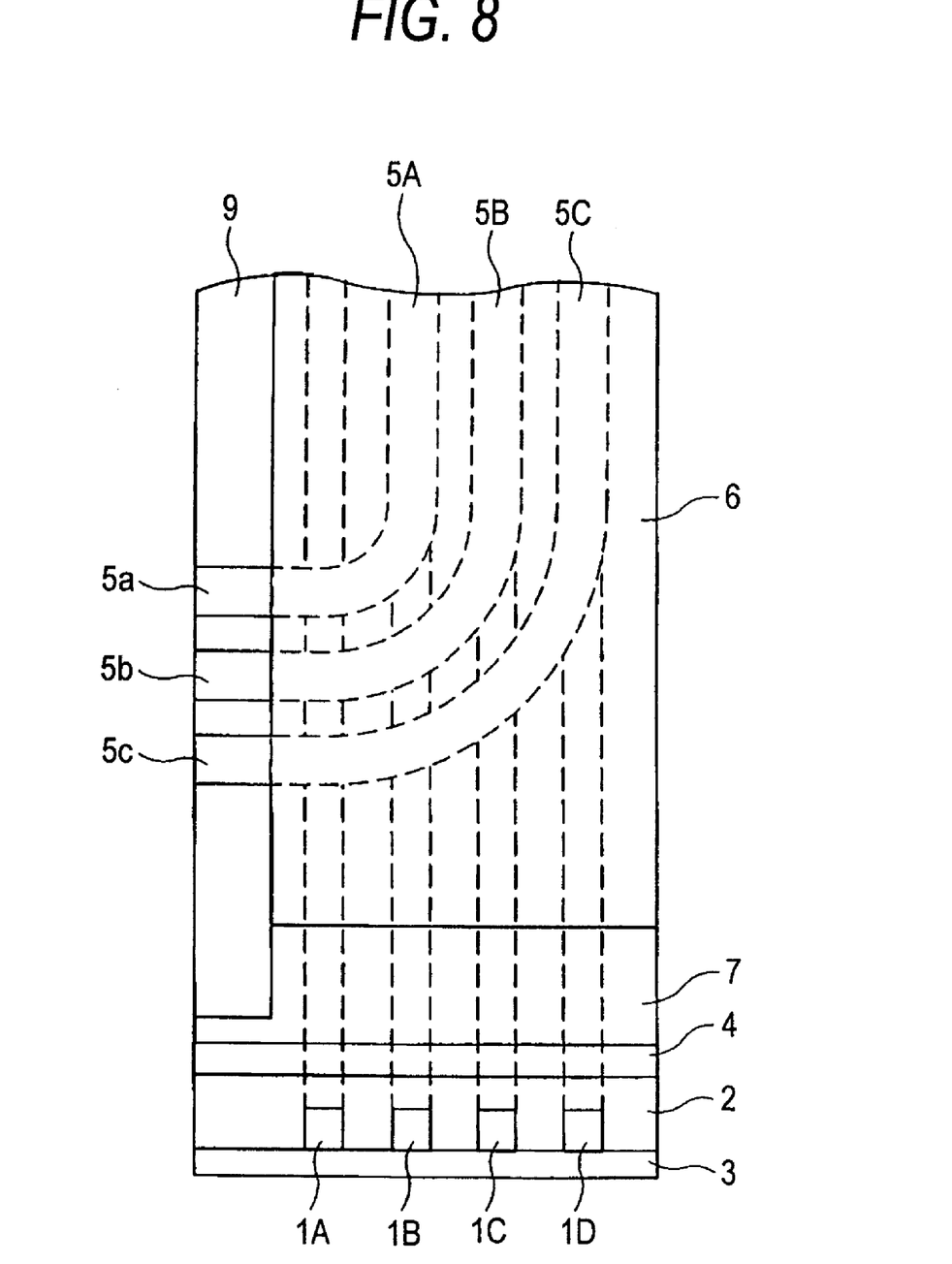
FIG. 8 is a plane view showing the polymer optical waveguide of FIG. 7.

FIG. 7 is a perspective view showing a polymer optical waveguide according to a third embodiment of the invention. Further, FIG. 8 is a plane view showing the polymer optical waveguide of FIG. 7.

In this embodiment, a different-in-level portion is provided, in the first embodiment, on one side surface of an insulating layer 6 in the longitudinal direction of waveguide cores 1A to 1D, thereby to form a different-in-level surface 9, and electrode surfaces 5a, 5b and 5c are pulled out on the different-in-level surface 9 by bending end portions of conductive lines 5A to 5C at 90 degrees. Other constitution is similar to those in the first embodiment. Though the number of cores is four including waveguide cores 1A to 1D, and the number of electrode surfaces is three including the electrode surfaces 5a to 5c, they may be arbitrary number.

The different-in-level surface 9 is formed, similarly to the case in the first embodiment, by cutting one side surface of the insulating layer 6 in the L-shape by means of a dicing saw so that predetermined portions of the electrode surfaces 5a to 5c are left and the necessary area of the electrode surfaces can be secured. Although the different-in-level surface 9 is provided, in FIG. 8, throughout a full length of a polymer optical waveguide 100, it may be provided in a predetermined range.

Also in this embodiment, similarly to the polymer optical waveguide 100 in the second embodiment, the polymer optical waveguide 100 is mounted on a printed board as shown in FIG. 4, and the electrode surfaces 5a to 5c are connected to various devices 15 on the printed board 11 through a bonding wire 16B.

Next, working examples according to the invention will be described.

Example 1

The present inventors manufactured the polymer optical waveguide 100 having the structure shown in the first embodiment as a first example. Firstly, by the method shown in FIGS. 5A to 5G, waveguide cores 1A to 1C each having a section of 50×50 μm were formed on a lower base material 3, a cladding 2 having a refractive index smaller than a refractive index of the waveguide core is provided and an upper base material 4 is provided on the upper portion of the cladding 2, thereby to manufacture an optical waveguide portion 10 having a length of 10 cm (FIG. 5D).

Further, after a thick film resist (for example, "SU-8", which is a product of Micro Chemical Corp.) was applied to a surface of a Si substrate by spin coating, it was prebaked at 80° C. Next, the thick film resist on the Si substrate was exposed through a photomask and developed, whereby a protrusion (200×200 μm) corresponding to the shapes of each conductive line 5A, 5B was formed on the Si substrate. Thereafter, the protrusion on the Si substrate was post-baked at 120° C., whereby a master 20 for manufacturing the conductive line was manufactured (FIG. 5A).

Next, after application of a releasing agent to the resulting master 20, a heat curable dimethylsiloxane resin (for example, "SYLGARD 184 (trademark registration), product of Down Corning Toray Co., Ltd) was poured in the master 20, left for a predetermined time, and thereafter subjected to vacuum deforming for about 10 minutes. The resin was cured by heating at 120° C. for 30 minutes and thereafter peeled from the master 20, whereby a mold (thickness: 5 mm) having a recess corresponding to the shape of the conductive line 5A, 5B was manufactured. Further, in both end portions of its mold communicating to the recesses, holes each having a diameter of 3 mm were formed as a filling port and a suction port, whereby formation of a mold 21 was completed. The mold 21, having mold recesses 21a corresponding to the two conductive lines 5A, 5B formed in parallel, was formed so that a size of a section of each mold recess 21a became 200×200 μm and the distance between the two mold recesses 21a became 1000 μm.

Next, the manufactured mold 21 and optical waveguide portion 10 were adhered to each other (FIG. 5D). Then, silver paste was fully filled in the filling port of the mold 21, and the silver paste was vacuum-sucked from the suction port of the mold 21 by means of a suction pump and by utilizing a capillary phenomenon, whereby the silver paste can be filled in the mold recess 21a.

Thereafter, the silver paste was heated by means of an electric oven at 130° C. for one hour and cured. Further, the cladding agent (insulating material) used in manufacture of the optical waveguide portion 10 was dropped on the upper surfaces and the side surfaces of the conductive lines 5A, 5B. Further, after the upper portion was covered with the same material as the lower base material 3 and the upper base material 4, it was exposed to ultraviolet rays and cured.

Next, by a dicing saw provided with an angled blade, the end portion of the optical waveguide portion 10 is cut so as to be inclined at 45 degrees, thereby to form an inclined surface 7.

Next, the upside of the end portion of the optical waveguide portion 10 having the conductive lines 5A, 5B was cut twice by a blade (blade width: 250 μm), so that the predetermined range (length: 450 μm and width: 200 μm) of the upper surface of the conductive line 5A, 5B was exposed as an electrode surface 5a, 5b, on the basis of a sectional position of 20 μm down from the upper portion of the conductive line 5A, 5B. This cutting of two times was performed with an overlapped portion of 50 μm so that the cutting width became 250 μm×2-50 μm=450 μm.

When propagation loss of the thus completed polymer optical waveguide 100 in the first example was measured, it was 0.1 dB/cm. Further, conduction between the electrodes located at both ends of the polymer optical waveguide 100 was confirmed.

Example 2

Next, the inventors manufactured a polymer optical waveguide 100 having the structure shown in the second embodiment shown in FIG. 6 as a second example.

Firstly, by the manufacturing process similar to that in the above first example, an optical waveguide portion 10 provided with conductive lines 5A, 5B and an insulating layer 6 and having a length of 10 cm was manufactured.

Next, a cut portion 8 was formed in the conductive lines 5A, 5B and the insulating layer 6. The cut portion 8 was formed by cutting, on the basis of a sectional position of 20 μm down from the upper portion of the conductive line 5A, 5B, portions of the conductive lines 5A, 5B and the insulating layer 6 which are 2000 μm distant in the longitudinal direction of waveguide cores 1A to 1C from the end portion, so that electrode surfaces 5a, 5b each having a length of 900 μm and a width of 200 μm were formed, by a blade (blade width: 250 μm) at four times in parallel. This cutting was performed so that an overlapped portion of 50 μm is produced two times similarly to the case in the first example.

When propagation loss of the thus completed polymer optical waveguide 100 in the second example was measured, it was 0.1 dB/cm. Further, conduction between the electrodes located at both ends of the polymer optical waveguide 100 was confirmed.

Embodiment 3

Next, the inventors manufactured a polymer optical waveguide 100 having the structure shown in the third embodiment shown in FIGS. 7 and 8 as a third example.

Firstly, by the manufacturing process similar to that in the above first example, an optical waveguide portion 10 provided with conductive lines 5A, 5B, 5C and an insulating layer 6 and having a length of 10 cm was manufactured.

Next, similarly to the case in the first example, the insulating layer 6 was provided on the upper base material 4. End portions of the conductive lines 5A, 5B and 5C, as shown in FIG. 8, were formed arcuately, and exposed to a side surface of the insulating layer 6.

Next, the end portions of the optical waveguide portion 10 and the insulating layer 6 were cut at 45 degrees thereby to form an inclined surface 7. Further, one side surface of the insulating layer 6 in the longitudinal direction of waveguide cores 1A to 1D was cut in the L-shape thereby to form a different-in-level surface 9.

Next, on the basis of a sectional position of 20 μm down from the upper portion of the conductive line 5A, 5B, 5C, portions of the conductive lines 5A, 5B, 5C and the insulating layer 6 which are 2000 μm distant in the longitudinal direction of waveguide cores 1A to 1C from the end portion were cut, so that electrode surfaces 5a, 5b, 5c each having a length of 450 μm and a width of 200 μm were formed, by a blade (blade width: 250 μm) at two times in each direction of a vertical direction and a horizontal direction. Cutting in the vertical direction and the horizontal direction were performed so that an overlapped portion of 50 μm was produced.

When propagation loss of the thus completed polymer optical waveguide 100 in the third example was measured, it was 0.1 dB/cm. Further, conduction between the electrodes located near both ends of the polymer optical waveguide 100 was confirmed.

Another Embodiment

The invention is not limited to the embodiments described above, but various modifications may be made in the invention without departing from the spirit of the invention. For example, combination of components among the respective embodiments can be arbitrarily performed.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. A polymer optical waveguide comprising:
    an optical waveguide portion that includes a core and a cladding each formed of polymer material; and
    a conductive line that is installed integrally with the optical waveguide portion, and that has an electrode surface for external connection exposed on a surface different from an end surface of the optical waveguide portion, wherein:
    an insulating layer is formed on a top surface of the conductive line, and
    the electrode surface is exposed by removing a portion of the insulating layer and a portion of the conductive line, such that the electrode surface is provided at a different level from the top surface of the conductive line.

2. The polymer optical waveguide as claimed in claim 1, wherein the end surface of the optical waveguide portion is inclined at 45 degrees.

3. The polymer optical waveguide as claimed in claim 1, wherein the electrode surface extends to the end surface of the optical waveguide portion.

4. The polymer optical waveguide as claimed in claim 1, wherein the electrode surface is provided at a predetermined distance from the end surface of the optical waveguide portion, and does not extend to the end surface of the optical waveguide portion.

5. The polymer optical waveguide as claimed in claim 1, wherein a longitudinal direction of the electrode surface is perpendicular to the longitudinal direction of the core.

6. The polymer optical waveguide as claimed in claim 1, wherein a longitudinal direction of the conductive line is parallel to a longitudinal direction of the core.

7. A method for manufacturing a polymer optical waveguide, comprising:
    manufacturing a master that has a protrusion having a shape corresponding to a shape of a conductive line;
    manufacturing a mold that has a recess corresponding to the protrusion from the master;
    manufacturing a conductive line by tightly adhering an optical waveguide portion formed by a core and a cladding, each formed of polymer material, to a recess forming surface of the mold, and by filling conductive material in the recess;
    releasing the mold from the optical waveguide portion;
    coating the conductive line with an insulating layer; and
    removing a surface other than an end surface of the optical waveguide portion and exposing a part of the conductive line thereby, such that the exposed surface is an electrode surface.

* * * * *